US006825713B2

(12) United States Patent
Benoist et al.

(10) Patent No.: US 6,825,713 B2
(45) Date of Patent: Nov. 30, 2004

(54) SYSTEM AND METHOD FOR BANDWIDTH ESTIMATION OF AN INTEGRATED FILTER

(75) Inventors: Frederic Benoist, Villeneuve Loubet (FR); Pascal Conteaux, Exanville (FR); Laurent C. Perraud, St Jeannet (FR); Christophe Pinatel, St Laurent Du Var (FR); Nicolas Sornin, Nice (FR)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 10/318,496

(22) Filed: Dec. 11, 2002

(65) Prior Publication Data

US 2003/0154231 A1 Aug. 14, 2003

(30) Foreign Application Priority Data

Dec. 11, 2001 (EP) ........................................ 01480125

(51) Int. Cl.[7] ........................................ H03K 5/00
(52) U.S. Cl. ........................................ 327/553
(58) Field of Search ........................................ 327/552–559

(56) References Cited

U.S. PATENT DOCUMENTS

| | | | | | |
|---|---|---|---|---|---|
| 5,281,931 | A | * | 1/1994 | Bailey et al. | 333/17.1 |
| 5,408,196 | A | * | 4/1995 | Sempel et al. | 329/325 |
| 6,212,367 | B1 | * | 4/2001 | Tolson | 455/114.2 |
| 6,356,142 | B1 | * | 3/2002 | Mittel | 327/553 |
| 6,420,916 | B1 | * | 7/2002 | Freeman | 327/156 |

* cited by examiner

*Primary Examiner*—Dinh T. Le
(74) *Attorney, Agent, or Firm*—Steven Capella

(57) ABSTRACT

A system for estimating the bandwidth of a baseband filter that produces a phase shift on arriving analog signals is disclosed. The system comprises means for generating a digital reference clock signal and means for converting the digital reference clock signal into an analog reference clock signal to be input to the baseband filter. Phase comparison means are coupled to the baseband filter for comparing the digital reference clock signal to the analog reference clock signal phase shifted through the baseband filter. A digital pulsed signal that is representative of the phase shift is generated, and digital circuit means connected to the phase comparison means convert the digital pulsed signal into a digital value, the digital value being proportional to the phase shift of the baseband filter.

20 Claims, 3 Drawing Sheets

SYSTEM AND METHOD FOR BANDWIDTH ESTIMATION OF AN INTEGRATED FILTER

BACKGROUND OF THE INVENTION

The present invention relates to filters in general and in particular to a method and system for estimating the bandwidth of an integrated filter.

Cellular telephones, as with most communication systems, require high gain baseband filters within the receive signal path. In such applications, the in-band signal is amplified and conveyed to subsequent stages for processing, e.g., to an analog-to-digital converter (ADC). This analog filtering serves two purposes: reducing the magnitude of interfering signals outside the band of interest; and providing anti-aliasing.

Continuous-time filters have become widely used in commercial applications. Two main categories of filters are currently used, the Gm-C filters using transconductors and capacitors or the active RC filters constructed from resistors, capacitors, and integrated amplifiers. A drawback of the existing filters used in VLSI applications is their sensibility to the manufacturing process and temperature variations, which may yield to a variation of the nominal value of the Gm or the RC product up to +/−50%. Consequently the bandwidth of the filter may also vary, and it has become necessary to tune the frequency response of the filters to compensate for these variations. However, in order to implement an accurate compensation system, it is appropriate to make a fine measurement of the filter bandwidth.

Several solutions have been proposed to measure the bandwidth of a filter. A first prior art uses an external clock system directly on the manufacturing line.

A second prior art that requires a fine clocking allows to measure the value of the RC product by measuring the charge time of a capacitor through a resistor. The drawback of this solution is the need of an accurate voltage reference.

There exists other methods that compare the oscillation frequencies of an internal and an external RC oscillator. However, these methods use analog circuits which require large silicon surfaces to implement.

SUMMARY OF THE INVENTION

In view of the foregoing and other problems of the conventional systems and methods, it is an object of the invention to provide a system for estimating the bandwidth of an integrated filter that is fully digital.

It is another object of the invention to provide a system that is easily integrated on integrated circuits.

These objects are achieved in a preferred embodiment, by a system for estimating the bandwidth of a baseband filter that produces a phase shift on arriving analog signals. The system comprises means for generating a digital reference clock signal and means for converting the digital reference clock signal into an analog reference clock signal to be input to the baseband filter. Phase comparison means are coupled to the baseband filter for comparing the digital reference clock signal to the analog reference clock signal phase shifted through the baseband filter. A digital pulsed signal that is representative of the phase shift is generated, and digital circuit means connected to the phase comparison means convert the digital pulsed signal into a digital value, the digital value being proportional to the phase shift of the baseband filter.

These and other aspects of the invention are described in further detail below.

DETAILED DESCRIPTION OF THE INVENTION

Figure 1:
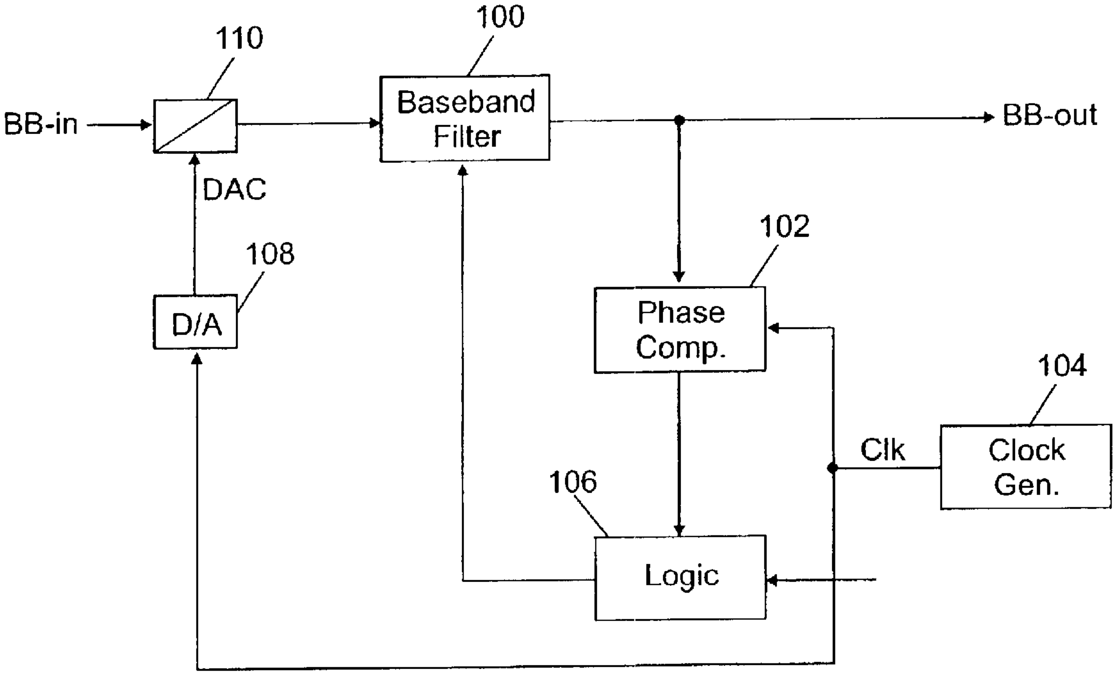
FIG. 1 is a general block diagram of a system incorporating the present invention.

Referring to the drawings, and more particularly to FIG. 1, a general block diagram of a system that incorporates the present invention is described. Generally speaking, the invention is preferably used in conjunction with a baseband signal path 100 that filters an input differential signal 'BB_in'. The output of the baseband filter 100 is a differential baseband output signal 'BB_out' filtered at a specific bandwidth, and to be used by an output load such as for example an A/D converter (not represented on the figure). A multiplexing device 110 is connected in front of the baseband filter 100 allowing to multiplex a time referenced analog signal 'DAC' to the differential baseband input signal 'BB_in' in order to select one or the other signal to be input to the baseband signal path.

The bandwidth estimation system of the present invention comprises a phase comparison system 102 that uses a clock referenced signal 'CLK' issued from a clock generator 104. It is one feature of the invention that no voltage reference is required as in many prior art systems, because the level of the input signals is not relevant for the phase comparison system.

The clock signal 'CLK' is also input to a digital logic block 106, and to a digital-to-analog converter (DAC) 108 that outputs the time referenced analog signal 'DAC'. The DAC 108 may simply be a conventional one bit DAC. It is to be noted that the analog reference precision for the DAC is not a concern for the operation of the invention.

In a direct reception mode, the baseband signal path 100 receives the input differential signal 'BB_in' and due to its filtering intrinsic AC characteristics, a phase shift 'PH_AC' is created between the input signal 'BB_in' and the output signal 'BB_OUT'.

In a bandwidth estimation mode, the multiplexer 110 provides the 'DAC' signal directly to the baseband signal path 100. A phase shift 'PH_AC' identical to the one of the direct reception mode is applied between the input signal 'DAC' and the output signal 'BB_OUT'.

It is to be appreciated by those skilled in the art that the principles used by the present invention are effective on various types of filter circuits, such as Gm-C or RC filters, even when the latter operate with external components.

In the bandwidth estimation mode, the phase comparator 102 compares the phase shifted output signal 'BB-OUT' to the clock referenced signal 'CLK'. A digital pulses stream is issued that contains the phase shift information. Those pulses are next input to the digital logic block 106, and a digital value which is proportional to the phase shift is issued.

This digital value can next be used to compute the bandwidth of the baseband signal path 100 thanks to the relationship between the phase and frequency set by the transfer function of the integrated filter. The digital value may also be used in a conventional frequency correction loop.

Figure 2:
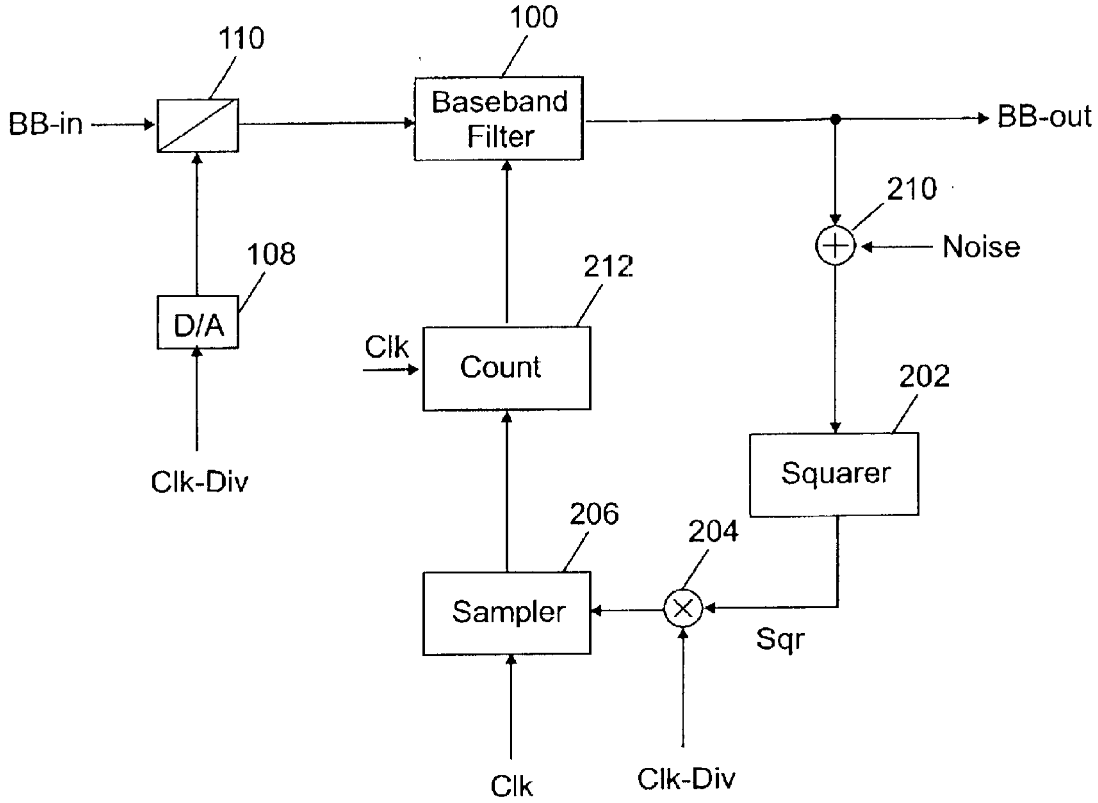
FIG. 2 is a more detailed block diagram of the preferred embodiment of the present invention.

Referring to FIG. 2, a detailed implementation of a preferred embodiment of the invention is illustrated wherein the baseband signal path is chosen as a second order filter 100 that provides a ninety degrees phase shift at its cut-off frequency. The phase comparator 102 comprises a squarer circuit 202, a XOR gate 204 and a sampler 206. In the bandwidth estimation mode, the squarer 202 inputs the phase shifted analog baseband signal 'BB-out' to provide a digital baseband signal 'SQR' having the same phase. The XOR gate 204 compares this digital baseband signal to a digital divided referenced clock signal 'CLK_DIV'. The divided referenced clock signal 'CLK_DIV' is generated by a clock divider 208 that inputs the referenced clock signal 'CLK'. In this preferred embodiment, the divided referenced clock signal 'CLK_DIV' is also input to the previously mentioned DAC 108. And, in the bandwidth estimation mode, the divided referenced clock signal converted by the DAC is propagated through the baseband signal path and the squarer to become the phase shifted squared signal 'SQR' that is compared into the XOR gate to the divided referenced clock signal 'CLK_DIV' issued directly from the clock generator 104.

The output of the XOR gate is sampled by the sampler circuit 206 that operates at the frequency of the referenced clock signal 'CLK'. The output of the sampler is a digital sampled signal that is next integrated by a counter 212 during a given time period T. Those skilled in the art will easily appreciated that the integrated value is proportional to divided referenced clock signal 'CLK_DIV' frequency.

In the preferred embodiment, the division ratio of the reference clock is chosen such that given a fixed frequency for the referenced clock signal 'CLK', the output of the divider is close in frequency to the target cut-off frequency of the baseband filter. In fact, the bandwidth estimation precision is improved when the invention operates at the peak value of the phase derivative. However, the system of the invention operates with any reference clock whose frequency is greater by an order of magnitude than the target cut-off frequency of the baseband filter.

Figure 3:
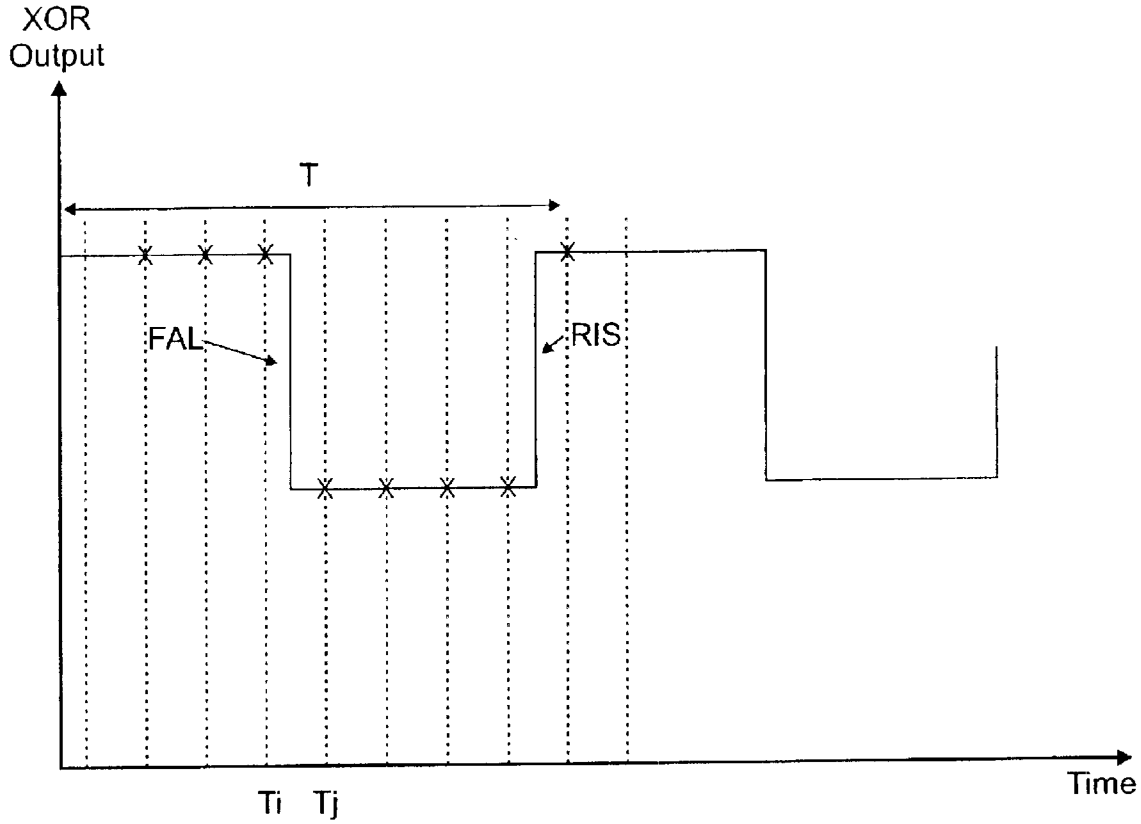
FIG. 3 shows a waveform of the sampled signal of the present invention.

When the two signals 'SQR' and 'CLK-DIV' at the input of the XOR gate are synchronous, i.e. having a constant phase shift, the phase comparison system is limited in its bandwidth precision to the value of the clock division ratio. As illustrated by the waveform of FIG. 3, the rising edge 'RIS' or the falling edge 'FAL' of the signal that is output from the XOR gate may occur at any time between a sampling window ($T_i$, $T_j$) without having any influence on the integrated value that is output by counter 212.

To overcome this limitation, the invention preferably implements a non-synchronous noise circuit 210 connected between the baseband filter 100 and the squarer 202. The noise source introduces a jitter on the phase shifted signal that is next transmitted at the XOR gate output. This jitter is preferably chosen greater in amplitude than the sampling window and having a null mean value. Thus the integration operation provided by counter 212 over a period 'T' filters the noise thereby providing a precision improved value. Then, the system efficiency results from a compromise between the integration time and the system required precision.

As the skilled man will readily understand the noise source circuit may be any kind of digital or analog source noise circuit, such as a free running voltage control oscillator (VCO) for example.

In an alternate implementation, the sampler 206 and the counter 212 may be replaced by an analog integrator. In such case, the synchronicity of the signals that are input at the XOR gate is not a limitation to the system precision, and the noise source may be avoided.

It is to be appreciated by those skilled in the art that while the invention has been particularly shown and described with reference to a preferred embodiment thereof, various changes in form and details may be made without departing from the spirit and scope of the invention.

What is claimed is:

1. A system for estimating the bandwidth of a baseband filter that produces a phase shift on arriving analog signals, the system comprising:

means for generating a digital reference clock signal;

means for converting the digital reference clock signal into an analog reference clock signal to be input to the baseband filter;

phase comparison means coupled to the baseband filter for comparing the digital reference clock signal to the analog reference clock signal phase shifted through the baseband filter and for generating a digital pulsed signal that is representative of the phase shift, and digital circuit means connected to the phase comparison means and to the baseline filter for converting the digital pulsed signal into a digital value, said digital value being proportional to the phase shift of the baseband filter.

2. The system of claim 1 wherein the phase comparison means further comprising a squaring circuit which responds to the phase shifted analog reference clock signal to produce a square wave output signal, and a XOR gate connected to the output of the squaring circuit to compare the square wave output signal to the digital reference clock signal.

3. The system of claim 2 wherein the clock generator means further comprising means for generating a frequency divided reference clock signal whereas the divided reference clock signal is input to the XOR gate.

4. The system of claim 1 wherein the digital circuit means further comprising a sampler circuit connected to the output of the comparison means to produce a digital signal at the frequency of the reference clock signal, and counting means connected to the output of the sampler circuit and operating at the frequency of the reference clock signal to produce said digital value.

5. The system of claim 1 wherein said converting means comprises a digital to analog converter receiving the frequency divided reference clock signal to produce said analog reference clock signal.

6. The system of claim 1 further comprising selection means coupled to the baseband filter to select an arriving analog signal.

7. The system of any one of claim 1 further comprising noise adding means operatively coupled to the comparison means for adding a noise signal to the phase shifted analog reference clock signal, said noise signal being a white noise with null mean value.

8. The system of claim 7 wherein the noise means further comprising an analog noise generator.

9. The system of claim 1 wherein the baseband filter is a second order filter.

10. The system of claim 1 wherein the baseband filter is an active RC filter.

11. The system of claim 2 wherein the clock generator means further comprising means for generating a frequency divided reference clock signal whereas the divided reference clock signal is input to the XOR gate.

12. The system of claim 2 wherein the digital circuit means further comprising a sampler circuit connected to the output of the comparison means to produce a digital signal at the reference clock frequency, and counting means connected to the output of the sampler circuit and operating at the reference clock frequency to produce said digital value.

13. The system of claim 3 wherein the digital circuit means further comprising a sampler circuit connected to the output of the comparison means to produce a digital signal at the reference clock frequency, and counting means connected to the output of the sampler circuit and operating at the reference clock frequency to produce said digital value.

14. The system of claim 2 wherein said converting means comprises a digital to analog converter receiving the frequency divided reference clock signal to produce said analog reference clock signal.

15. The system of claim 3 wherein said converting means comprises a digital to analog converter receiving the frequency divided reference clock signal to produce said analog reference clock signal.

16. The system of claim 4 wherein said converting means comprises a digital to analog converter receiving the frequency divided reference clock signal to produce said analog reference clock signal.

17. The system of claim 2 further comprising selection means coupled to the baseband filter to select an arriving analog signal.

18. The system of claim 3 further comprising selection means coupled to the baseband filter to select an arriving analog signal.

19. The system of claim 4 further comprising selection means coupled to the baseband filter to select an arriving analog signal.

20. The system of claim 5 further comprising selection means coupled to the baseband filter to select an arriving analog signal.

* * * * *